United States Patent
Obiya et al.

(10) Patent No.: US 9,780,735 B1
(45) Date of Patent: Oct. 3, 2017

(54) HIGH-FREQUENCY SIGNAL AMPLIFIER CIRCUIT, POWER AMPLIFIER MODULE, FRONT-END CIRCUIT, AND COMMUNICATION APPARATUS

(71) Applicant: Murata Manufacturing Co., Ltd., Kyoto (JP)

(72) Inventors: Hidenori Obiya, Kyoto (JP); Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/472,722

(22) Filed: Mar. 29, 2017

(30) Foreign Application Priority Data

Mar. 30, 2016 (JP) ................................ 2016-069734

(51) Int. Cl.
| | |
|---|---|
| *H03F 1/26* | (2006.01) |
| *H04B 1/16* | (2006.01) |
| *H03F 3/195* | (2006.01) |
| *H03F 1/56* | (2006.01) |
| *H03F 3/213* | (2006.01) |

(52) U.S. Cl.
CPC ............... *H03F 1/26* (2013.01); *H03F 1/56* (2013.01); *H03F 3/195* (2013.01); *H03F 3/213* (2013.01); *H04B 1/16* (2013.01); *H03F 2200/165* (2013.01); *H03F 2200/171* (2013.01); *H03F 2200/222* (2013.01); *H03F 2200/318* (2013.01); *H03F 2200/387* (2013.01); *H03F 2200/451* (2013.01); *H03F 2200/555* (2013.01)

(58) Field of Classification Search
CPC .... H03F 2200/451; H03F 3/195; H03F 1/301; H03F 1/56; H03F 3/189; H03F 1/26; H03F 1/0205; H03F 3/45179; H03F 1/565; H03F 2200/27; H03F 2200/423; H03F 1/083; H03F 3/213
USPC .... 455/341, 334, 127.1, 114.3, 114.2, 114.1, 455/129, 128, 403, 426.1, 426.2; 330/285, 307, 136, 126, 261
See application file for complete search history.

(56) References Cited

U.S. PATENT DOCUMENTS

2015/0054587 A1* 2/2015 Yoshizaki ............. H03F 1/0261
                                                                    330/296

FOREIGN PATENT DOCUMENTS

| JP | 2003-283274 A | 10/2003 |
| WO | 2014/087479 A1 | 6/2014 |

* cited by examiner

*Primary Examiner* — Keith Ferguson
(74) *Attorney, Agent, or Firm* — Pearne & Gordon LLP

(57) ABSTRACT

A high-frequency signal amplifier circuit is used in a front-end circuit configured to propagate a high-frequency transmission signal and a high-frequency reception signal, and includes an amplifier transistor configured to amplify the high-frequency transmission signal; a bias circuit configured to supply a bias to a signal input end of the amplifier transistor; and a ferrite bead, one end of which is connected to a bias output end of the bias circuit and the other end of which is connected to the signal input end of the amplifier transistor, having characteristics in which impedance in a difference frequency band between the high-frequency transmission signal and the high-frequency reception signal is higher than impedance in DC.

13 Claims, 5 Drawing Sheets

HIGH-FREQUENCY SIGNAL AMPLIFIER CIRCUIT, POWER AMPLIFIER MODULE, FRONT-END CIRCUIT, AND COMMUNICATION APPARATUS

This application claims priority from Japanese Patent Application No. 2016-069734 filed on Mar. 30, 2016. The contents of this application are incorporated herein by reference in its entirety.

BACKGROUND

The present disclosure relates to high-frequency signal amplifier circuits, power amplifier modules, front-end circuits, and communication apparatuses.

Nowadays, a cellular phone is required to support a plurality of frequency bands (multiband use) while the cellular phone being a single terminal. A front-end circuit that supports the multiband use is required to propagate transmission and reception signals corresponding to a plurality of frequency bands without necessarily the transmission and reception signals being deteriorated. As such, a high-frequency signal amplifier circuit for amplifying the transmission signal is required to lower a reception band noise level during a transmission time while maintaining high amplification performance.

International Publication No. WO 2014/087479 discloses a high-frequency power amplifier that aims at suppressing out-of-band noise. FIG. 7 is a circuit block diagram of the high-frequency power amplifier described in International Publication No. WO 2014/087479. The high-frequency power amplifier shown in FIG. 7 includes an RF input terminal 501, an RF output terminal 505, an input matching circuit 502, a high-frequency signal amplifier transistor 503, an output matching circuit 504, a bias circuit 506, and a series resonance circuit 507. One end of the series resonance circuit 507 is connected between the high-frequency signal amplifier transistor 503 and the bias circuit 506 while the other end thereof is grounded, and the series resonance circuit 507 includes an inductor 508 and a capacitor 509. According to this configuration, a situation where noise of a difference frequency band generated in the bias circuit 506 is inputted into the high-frequency signal amplifier transistor 503 can be suppressed, whereby out-of-band noise can be suppressed without necessarily lowering a transmission band gain.

BRIEF SUMMARY

Note that, however, with the high-frequency power amplifier disclosed in International Publication No. WO 2014/087479, a high-frequency transmission signal enters into the bias circuit and oscillation is likely to occur. To deal with this, it can be considered to insert a resistor between the input terminal of the high-frequency signal and the bias circuit so as to bring a damping effect. However, in this case, when a DC bias current is supplied from the bias circuit, a voltage applied to the base of the high-frequency signal amplifier transistor is dropped due to the stated resistor, thereby raising a problem that an operating range of the high-frequency signal amplifier transistor is suppressed and another problem that saturation output or power added efficiency is lowered.

The present disclosure has been conceived to solve the above problems and to provide a high-frequency signal amplifier circuit that lowers a reception band noise level during a transmission time while maintaining saturation output or power added efficiency of a high-frequency power amplifier; a power amplifier module; a front-end circuit; and a communication apparatus.

A high-frequency signal amplifier circuit according to an embodiment of the present disclosure is a high-frequency signal amplifier circuit that is used in a front-end circuit configured to propagate a high-frequency transmission signal and a high-frequency reception signal, and includes an amplifier transistor configured to amplify the high-frequency transmission signal, a bias circuit configured to supply a bias to a signal input end of the amplifier transistor, and a ferrite bead, one end of which is connected to a bias output end of the bias circuit and the other end of which is connected to the above-mentioned signal input end, having characteristics in which impedance in a difference frequency band between the high-frequency transmission signal and the high-frequency reception signal is higher than impedance in DC.

Due to the above-mentioned impedance characteristics of the ferrite bead, the ferrite bead can absorb a signal component of the difference frequency band so as to suppress the generation of the stated signal component. This makes it possible to suppress a high-frequency reception signal component produced by mixing the high-frequency transmission signal and the difference frequency band component in the bias circuit and stably suppress out-of-band noise. In addition, because the impedance of the ferrite bead is relatively low in DC, a voltage drop can be suppressed when a bias current is supplied from the bias circuit to the amplifier transistor. This makes it possible to lower a reception band noise level during the transmission time while maintaining saturation output or power added efficiency of the high-frequency signal amplifier circuit.

The ferrite bead may have characteristics in which impedance at a transmission frequency of the high-frequency transmission signal is lower than impedance in a difference frequency band between the high-frequency transmission signal and the high-frequency reception signal.

Because of this, the ferrite bead can suppress a decrease in power of the high-frequency transmission signal without necessarily absorbing a high-frequency transmission signal component. As such, the high-frequency reception signal component produced by mixing the high-frequency transmission signal and the difference frequency band component in the bias circuit can be further suppressed so as to stably suppress the out-of-band noise while maintaining saturation output or power added efficiency of the amplifier transistor.

The ferrite bead may be formed with a ferrite containing Ni and Zn.

The ferrite containing Ni and Zn is a material capable of lowering impedance in DC and raising impedance in a desired high-frequency band by increasing magnetic permeability, because frequency dependence of the magnetic permeability varies in accordance with a composition ratio of the material. This makes it possible to optimize the frequency characteristics of impedance of the ferrite bead corresponding to the frequency band to be used and the above-mentioned difference frequency band.

A power amplifier module according to an embodiment of the present disclosure may include a preceding amplifier device configured to amplify a high-frequency transmission signal and a subsequent amplifier device configured to amplify the high-frequency transmission signal having been amplified by the preceding amplifier device, and the subsequent amplifier device may be configured of the aforementioned high-frequency signal amplifier circuit.

In order to enhance the performance of a power amplifier module in which a plurality of amplifier devices are disposed in multiple stages, it is most important to enhance amplification performance and noise suppressing performance of the amplifier device in the last stage where high power is processed. According to the above configuration, the subsequent amplifier device is configured of the high-frequency signal amplifier circuit having the above-mentioned feature, thereby making it possible to efficiently optimize the amplification performance and noise suppressing performance of the power amplifier module.

Further, a power amplifier module may include a preceding amplifier device configured to amplify a high-frequency transmission signal, a subsequent amplifier device configured to amplify the high-frequency transmission signal having been amplified by the preceding amplifier device, and an amplification controller configured to control amplification characteristics of the preceding amplifier device and the subsequent amplifier device corresponding to a frequency band of the high-frequency transmission signal. The preceding amplifier device may be configured of the above-described high-frequency signal amplifier circuit, the amplification controller and the preceding amplifier device excluding the ferrite bead may be integrated in a first chip as a single chip, the first chip and the subsequent amplifier device may be disposed on a mounting surface of a substrate, and the ferrite bead may be arranged and laminated so as to overlap with the first chip in a planar view of the substrate (viewed from a direction perpendicular to the mounting surface of the substrate).

With this, the amplification controller is integrated in a single chip along with the preceding amplifier device which is unlikely to be interfered with by a high-frequency transmission signal, thereby making it possible to realize compactness in size while maintaining quality of high-frequency signals. Moreover, in addition to an area-saving brought by the integration of the preceding amplifier device and the amplification controller in a single chip, an additional area-saving by the lamination of the first chip and the ferrite bead can be accomplished in the power amplifier module. This makes it possible to realize more compactness in size while maintaining the quality of high-frequency signals.

The first chip may be configured of a CMOS.

With this, the power amplifier module can be manufactured at a lower cost, because the amplification controller and the preceding amplifier device for which power handling is not needed are configured of the CMOS.

Further, the first chip may be formed of GaAs.

With this, a high-frequency transmission signal having high-quality amplification performance and noise suppressing performance can be outputted.

A front-end circuit according to an embodiment of the present disclosure may include the aforementioned power amplifier module, a transmission filter device and a reception filter device, and a branching filter that outputs a high-frequency reception signal from an antenna device to the reception filter device and also outputs a high-frequency transmission signal, which is amplified by the power amplifier module and then passes through the transmission filter, to the antenna device.

With the above configuration, a front-end circuit configured to lower a reception band noise level during the transmission time while maintaining amplification performance for high-frequency transmission signals can be provided.

Further, the front-end circuit may include a variable filter circuit that is disposed between the preceding amplifier device and the subsequent amplifier device and varies a pass band or an attenuation band corresponding to a frequency band of the high-frequency transmission signal, wherein the pass band may be a transmission band corresponding to a communication band in use selected from a plurality of communication bands, and the attenuation band may be a reception band corresponding to the communication band in use.

With this, because a power amplifier module corresponding to a plurality of frequency bands can be configured, a front-end circuit supporting the multiband use can be provided in which a reception band noise level during the transmission time is lowered while maintaining the amplification performance for high-frequency transmission signals.

A communication apparatus according to an embodiment of the present disclosure may include the above-described front-end circuit, an RF signal processing circuit configured to output a high-frequency transmission signal to the front-end circuit and receive a high-frequency reception signal from the front end circuit, and a baseband signal processing circuit that converts the high-frequency reception signal inputted from the RF signal processing circuit to an intermediate frequency signal and performs signal processing thereupon, and converts the intermediate frequency signal to a high-frequency signal so as to output the converted signal to the RF signal processing circuit.

With the above configuration, a communication apparatus in which a reception band noise level during the transmission time is lowered while maintaining the amplification performance for high-frequency transmission signals can be provided.

With the high-frequency signal amplifier circuit according to the embodiments of the present disclosure, it is possible to lower a reception band noise level during the transmission time while maintaining the amplification performance for high-frequency transmission signals.

Other features, elements, characteristics and advantages of the present disclosure will become more apparent from the following detailed description of embodiments of the present disclosure with reference to the attached drawings.

DETAILED DESCRIPTION

Figure 1:
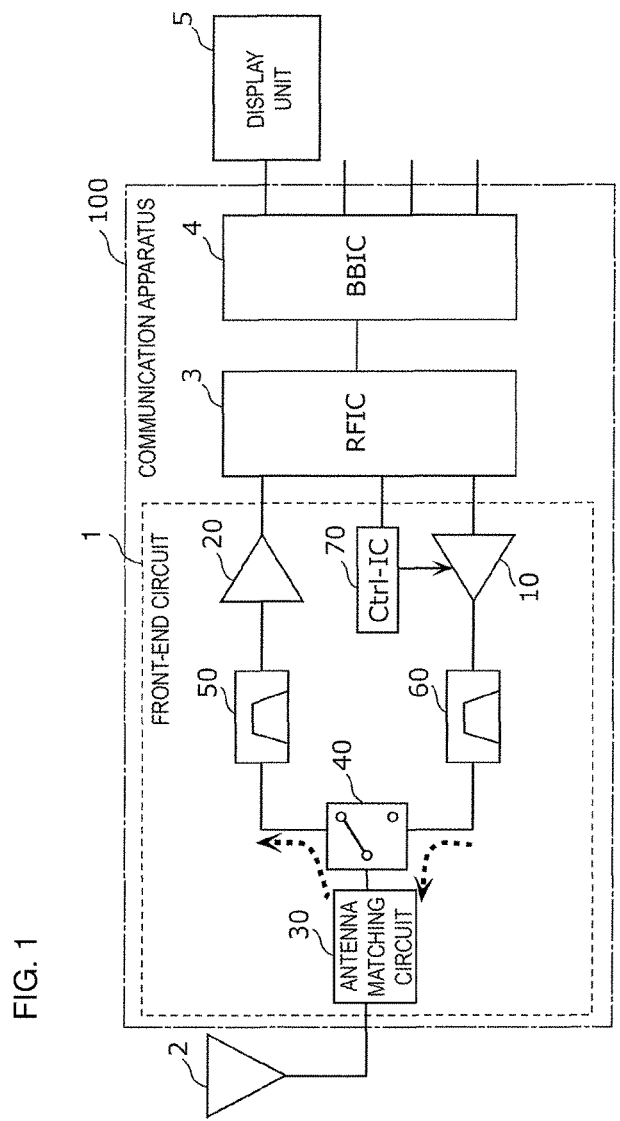
FIG. 1 is a functional block configuration diagram of a communication apparatus according to a first embodiment.

Hereinafter, embodiments of the present disclosure will be described in detail with reference to the respective embodiments and drawings thereof. Note that any of the embodiments described below represents a general or specific example. Numeric values, shapes, materials, constituent elements, arrangement of the constituent elements, connection modes of the constituent elements, and the like described in the following embodiments are merely examples and are not intended to limit the present disclosure. Of the constituent elements included in the following embodiments, those that are not described in the independent aspects of the disclosure will be described as arbitrary constituent elements. Sizes or size ratios of the constituent elements indicated in the drawings are not necessarily accurate.

First Embodiment 1.1 Configuration of Communication Apparatus

FIG. 1 is a functional block configuration diagram of a communication apparatus 100 according to a first embodiment. In FIG. 1, the communication apparatus 100, an antenna device 2, and a display unit 5 are illustrated. The communication apparatus 100 includes a front end circuit 1, an RF signal processing circuit (RFIC) 3, and a baseband signal processing circuit (BBIC) 4. The front-end circuit 1 is disposed, for example, in a front-end section of a cellular phone supporting multimode/multiband use.

The front-end circuit 1 includes a PA (Power Amplifier) module 10, a low noise amplifier circuit 20, an antenna matching circuit 30, an antenna switch 40, a reception filter 50, a transmission filter 60, and a control IC 70.

The antenna matching circuit 30 is a circuit that is connected to the antenna device 2 and the antenna switch 40, and achieves matching between the antenna device 2 and the front-end circuit 1. This makes it possible for the front-end circuit 1 to receive a reception signal with low loss from the antenna device 2 and output a transmission signal with low loss to the antenna device 2. The antenna matching circuit 30 is configured of one or more high-frequency circuit components, that is, configured of an inductor formed in a chip shape or a pattern and a capacitor formed in a chip shape or a pattern, for example. Note that the antenna matching circuit 30 is not an absolutely necessary constituent element of the front-end circuit 1. Further, the antenna matching circuit 30 may be a variable matching circuit that corresponds to multiband and multimode use and varies impedance corresponding to a band or mode to be selected.

The antenna switch 40 is a branching filter configured to switch the connection between the antenna device 2 and a plurality of signal paths by connecting the antenna device 2 (as well as the antenna matching circuit 30) to either a transmission-side signal path or a reception-side signal path. To be more specific, the antenna switch 40 includes a common terminal connected to the antenna matching circuit 30 and two selection terminals connected to the transmission-side signal path or the reception-side signal path.

Although, in FIG. 1, a single pole double throw high-frequency switch is illustrated as the antenna switch 40, the antenna switch 40 is not limited to a 1-input and 2-output type in the case where a plurality of transmission-side signal paths and a plurality of reception-side signal paths are disposed. Further, in place of the antenna switch 40, a duplexer or a multiplexer including a triplexer configured to separate the transmission waves and reception waves may be disposed.

The reception filter 50 is a reception filter device that performs filtering in a predetermined pass band on a reception signal having been received by the antenna device 2 and then having passed through the antenna switch 40, and outputs the filtered signal to the low noise amplifier circuit 20.

The transmission filter 60 is a transmission filter device that performs filtering in a predetermined pass band on a transmission signal having been outputted from the PA module 10, and outputs the filtered signal to the antenna device 2 via the antenna switch 40.

The PA module 10 is a power amplifier module that amplifies a high-frequency transmission signal outputted from the RF signal processing circuit 3, and outputs the amplified signal toward the antenna switch 40. The PA module 10 is a principal portion of the present disclosure and will be explained later in detail.

The low noise amplifier circuit 20 is a high-frequency amplifier circuit that amplifies a high-frequency reception signal outputted from the antenna switch 40, and outputs the amplified signal to the RF signal processing circuit 3.

The RF signal processing circuit 3 performs signal processing by down-converting or the like on a high-frequency reception signal inputted from the antenna device 2 through the reception-side signal path, and outputs the reception signal generated through the above signal processing to the baseband signal processing circuit 4. The RF signal processing circuit 3 is an RFIC (Radio Frequency Integrated Circuit), for example. In addition, the RF signal processing circuit 3 performs signal processing by up-converting or the like on a transmission signal inputted from the baseband signal processing circuit 4, and outputs the high-frequency transmission signal generated through the above signal processing to the PA module 10.

The baseband signal processing circuit 4 is a circuit that performs signal processing using an intermediate frequency band which is lower in frequency than the high-frequency signal in the front-end section. An image signal processed in the baseband signal processing circuit 4 is used, for example, for an image display in the display unit 5, and a sound signal processed in the baseband signal processing circuit 4 is used for a call via a speaker, for example.

The front-end circuit 1 may be so configured as to not include at least one of the reception filter 50 and the transmission filter 60 in accordance with the required specifications.

Although, in FIG. 1, the front-end circuit 1 is configured to include a single transmission-side signal path and a single reception-side signal path, the configuration may be such that a plurality of transmission-side signal paths and a plurality of reception-side signal paths are provided so as to support multiband use. In this case, the PA module 10, the low noise amplifier circuit 20, the reception filter 50, and the transmission filter 60 may be disposed in every signal path corresponding to each of the frequency bands. Further, the PA module 10, the low noise amplifier circuit 20, the reception filter 50, and the transmission filter 60 may be so configured as to be capable of varying bandpass characteristics and amplification characteristics corresponding to the selected frequency band, and in this case, the numbers thereof may be smaller than the number of signal paths.

1.2 Configuration of PA Module

Figure 2:
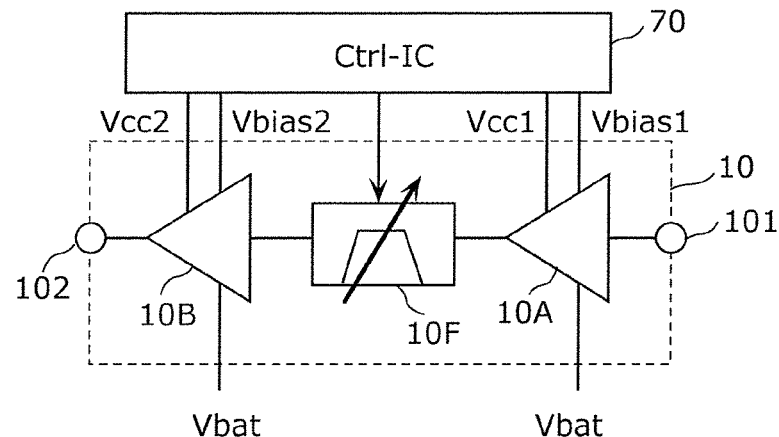
FIG. 2 is a circuit configuration diagram of a PA module according to the first embodiment.

FIG. 2 is a circuit configuration diagram of the PA module 10 according to the first embodiment. Note that in FIG. 2, the control IC (Ctrl-IC) 70 configured to control amplification characteristics of the PA module 10 is illustrated as well.

The PA module 10 includes a preceding amplifier device 10A, a subsequent amplifier device 10B, and a variable filter circuit 10F.

The preceding amplifier device 10A amplifies a high-frequency transmission signal inputted from an input terminal 101, and the subsequent amplifier device 10B amplifies the high-frequency signal having been amplified by the preceding amplifier device 10A so as to output the amplified signal to an output terminal 102. The input terminal 101 is connected to the RF signal processing circuit 3 and the output terminal 102 is connected to the transmission filter 60.

The variable filter circuit 10F is a circuit that is disposed between the preceding amplifier device 10A and the subsequent amplifier device 10B, and varies the pass band or attenuation band corresponding to a frequency band of the high-frequency transmission signal or a selected channel. The pass band and attenuation band of the variable filter circuit 10F can be varied by a control signal outputted from the control IC 70.

The variable filter circuit 10F is configured of a switch device and a plurality of filter devices of which pass bands and attenuation bands are mutually different, for example. The plurality of filter devices are typically band pass filters; however, they may be low pass filters, high pass filters, or band elimination filters depending on a frequency allocation relationship among the plurality of pass bands. As the plurality of filter devices, a surface acoustic wave filter, a boundary acoustic wave filter, an elastic wave filter using BAW (Bulk Acoustic Waves), an LC filter configured of an inductance element and a capacitor element, and the like can be exemplified. The number of the plurality of filter devices is determined in accordance with the number of bands to be used. Further, at least one or more filter devices of the plurality of filter devices may be through-paths. The through-path refers to a transmission line of distributed constant type.

The above-mentioned switch device is disposed, for example, between the preceding amplifier device 10A and the plurality of filter devices, and switches the connection between the output terminal of the preceding amplifier device 10A and the plurality of filter devices. Another switch device may also be disposed between the subsequent amplifier device 10B and the plurality of filter devices. The above switch devices switch the connections between the preceding amplifier device 10A as well as the subsequent amplifier device 10B and the plurality of filter devices in response to a control signal supplied from the control IC 70.

The control IC 70 is an amplification controller configured to control the amplification characteristics of the preceding amplifier device 10A and the subsequent amplifier device 10B corresponding to the frequency band of the high-frequency transmission signal or the selected channel. The amplification characteristics of the preceding amplifier device 10A and the subsequent amplifier device 10B are, for example, gains (amplification ratios) of the preceding amplifier device 10A and the subsequent amplifier device 10B. Further, the control IC 70 controls the switch device in the variable filter circuit 10F based on a control signal supplied from the RF signal processing circuit 3 or the baseband signal processing circuit 4 and indicating the communication band (frequency band of the high-frequency signal) to be selected and used. To be more specific, in the case where the above control signal indicates the selection of a band A, for example, the control IC 70 takes the transmission band of the band A as a pass band, and controls the switch device so that the filter device in which the reception band of the band A is taken as an attenuation band is connected to the preceding amplifier device 10A and the subsequent amplifier device 10B.

According to the above configuration, a high-frequency transmission signal inputted from the RF signal processing circuit 3 to the PA module 10 is amplified by the preceding amplifier device 10A. The amplified high-frequency transmission signal is inputted to the variable filter circuit 10F. The high-frequency transmission signal inputted to the variable filter circuit 10F passes through the filter device which is appropriate for the communication method and communication band. The high-frequency transmission signal having passed through the variable filter circuit 10F is further amplified by the subsequent amplifier device 10B, and then outputted from the PA module 10A.

When a high-frequency transmission signal including a selected frequency band is amplified by the PA module 10, although a reception band component in the above frequency band is also amplified by the preceding amplifier device 10A, the amplified reception band component is attenuated to some degree by passing through the filter device that is selected based on the selected frequency band. This makes it possible to suppress a situation where the amplified reception band component enters into the low noise amplifier circuit 20 or the like and becomes a reception band noise.

With the above configuration, requirements to the characteristics of the filter, the antenna switch, and the like disposed in the subsequent stage of the RF signal processing circuit 3 and the PA module 10 can be lessened, and the circuit in which an increase in area is suppressed to the minimum can be realized.

1.3 Configuration of High-Frequency Signal Amplifier Circuit

Hereinafter, a circuit configuration of the preceding amplifier device 10A according to the present embodiment will be described.

Figure 3:
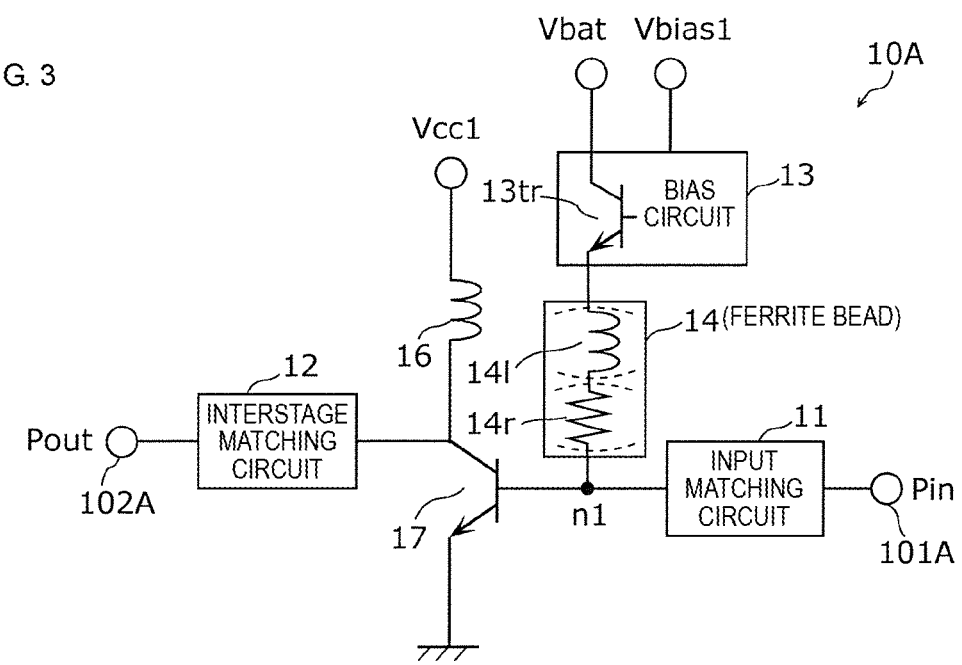
FIG. 3 is a circuit configuration diagram of a high-frequency signal amplifier circuit according to the first embodiment.

FIG. 3 is a circuit configuration diagram of the preceding amplifier device 10A according to the first embodiment. The preceding amplifier device 10A according to the present embodiment is configured of a high-frequency signal amplifier circuit as shown in FIG. 3. The high-frequency amplifier circuit shown in FIG. 3 includes a high-frequency input terminal 101A, a high-frequency output terminal 102A, an input matching circuit 11, an interstage matching circuit 12, an amplifier transistor 17, a bias circuit 13, a choke coil 16, and a ferrite bead 14.

The amplifier transistor 17 is a transistor that amplifies a high-frequency transmission signal inputted from the high-frequency input terminal 101A and is formed of GaAs, for example; a field effect transistor (FET) and a hetero bipolar transistor (HBT) can be mainly cited as the amplifier transistor 17. The base terminal (signal input terminal) of the amplifier transistor 17 is connected to the high-frequency input terminal 101A through the input matching circuit 11, the collector terminal thereof is connected to a power supply Vcc1 through the choke coil 16, and the emitter terminal thereof is grounded.

The bias circuit 13 is configured of a DC current supply transistor 13$tr$ and other circuit elements. The bias circuit 13 supplies a DC bias current to the amplifier transistor 17 from the DC current supply transistor 13$tr$ with a bias power supply Vbat and a reference voltage Vbias1 being supplied thereto.

The input matching circuit 11 performs matching on the impedance of a high-frequency transmission signal inputted to the high-frequency input terminal 101A, thereby suppressing reflection of the high-frequency signal from the amplifier transistor 17.

The interstage matching circuit 12 performs matching on the impedance of the high-frequency transmission signal amplified by the amplifier transistor 17, thereby suppressing the reflection of the high-frequency signal from the high-frequency output terminal 102A. The high-frequency transmission signal inputted to the amplifier transistor 17 is amplified by the amplifier transistor 17, and is outputted to the variable filter circuit 10F passing through the interstage matching circuit 12 and the high-frequency output terminal 102A.

The ferrite bead 14 is a ferrite device, one end of which is connected to a bias current output end of the bias circuit 13 and the other end of which is connected to a connection node n1 between the base terminal (signal input end) of the amplifier transistor 17 and the input matching circuit 11.

Figure 4:
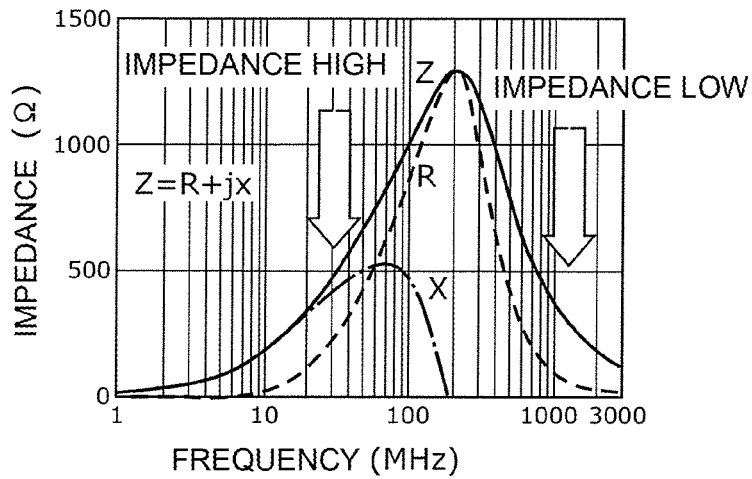
FIG. 4 is a graph depicting frequency characteristics of impedance of a ferrite bead according to the first embodiment.

FIG. 4 is a graph depicting frequency characteristics of impedance of the ferrite bead 14 according to the first embodiment. In FIG. 4, frequency characteristics of impedance Z (including resistance R and reactance X) of the ferrite bead 14 are indicated. The ferrite bead 14 is, as shown in FIG. 3, configured of a resistance component $14r$ and an inductance component 14l, and has such properties that the inductance component 14l plays a main role in a low frequency region, while in a high-frequency region, the resistance component $14r$ plays a main role. With this, as shown in FIG. 4, the impedance of the ferrite bead 14 has frequency dependence.

Here, it is assumed that a frequency band used in the front-end circuit 1 is Band 8 (transmission band: 880 MHz-915 MHz, reception band: 925 MHz-960 MHz) and a difference frequency band $|f_{Tx}\text{-}f_{Rx}|$ is 30 MHz-200 MHz, for example. Note that $f_{Tx}$ is a center frequency in the transmission band, and $f_{Rx}$ is a center frequency in the reception band.

As shown in FIG. 4, impedance of the ferrite bead 14 in DC is approximately 0. Further, impedance in the difference frequency band $|f_{Tx}\text{-}f_{Rx}|$ is no less than approximately 500Ω, and impedance in the transmission frequency of the high-frequency transmission signal is no more than 500Ω.

In other words, the ferrite bead 14 according to the present embodiment has characteristics such that the impedance in the difference frequency band $|f_{Tx}\text{-}f_{Rx}|$ is higher than the impedance in DC.

This makes it possible for the ferrite bead 14 to absorb a signal component of the difference frequency band $|f_{Tx}\text{-}f_{Rx}|$ by heat conversion and suppress the generation of the stated signal component. With this, a high-frequency reception signal component (frequency $f_{Rx}$) generated by mixing a high-frequency transmission signal (frequency $f_{Tx}$) and the difference frequency band component $|f_{Tx}\text{-}f_{Rx}|$ in the bias circuit 13 is suppressed so that the out-of-band noise can be stably suppressed. Moreover, since the impedance of the ferrite bead 14 in DC is relatively low, a voltage drop can be suppressed when a bias current is supplied from the bias circuit 13 to the amplifier transistor 17. This makes it possible to maintain the saturation output or power added efficiency of the high-frequency signal amplifier circuit. In other words, a reception band noise level during the transmission time can be lowered while maintaining the amplification performance for high-frequency transmission signals.

Note that the saturation output refers to a maximum output in a saturation region. The saturation region is a region where a gain in a linear region cannot be kept in the case where an input level to the RF input terminal is raised.

The power added efficiency refers to a ratio of a difference between the output power and the input power of the power amplifier to DC power consumption (the product of a Vcc1 voltage and a current flowing from the collector terminal to the emitter terminal).

In addition, the ferrite bead 14 according to the present embodiment has characteristics such that the impedance at the transmission frequency $f_{Tx}$ of the high-frequency transmission signal is lower than the impedance in the difference frequency band $|f_{Tx}\text{-}f_{Rx}|$.

This makes it possible for the ferrite bead 14 to suppress a reduction in power of the high-frequency transmission signal without necessarily absorbing a high-frequency transmission signal component (frequency $f_{Tx}$) propagating toward the bias circuit 13.

Here, examples of actual measurement of reception band noise of a high-frequency signal amplifier circuit according to a comparative example and reception band noise of the high-frequency signal amplifier circuit according to the present embodiment will be described. According to the LTE (Long Term Evolution) standards, the output power of the high-frequency transmission signal outputted from the antenna device 2 must be no less than about 25 dBm. As such, in the case where attenuation between the PA module 10 and the antenna device 2 is assumed to be about 3 dB, the output power of the PA module 10 needs to satisfy the value of about 28 dBm.

The reception band noise of the PA module 10 under an output power condition (about 28 dBm) was measured (1) in the comparative example where the ferrite bead 14 was not disposed, and (2) in a working example where the ferrite bead 14 was disposed in series between the bias circuit 13 and the connection node n1. The measurement results thereof are shown in Table 1.

TABLE 1

|  | Reception Band Noise at Pout = 28 dBm (dBm/Hz) |
| --- | --- |
| Comparative Example | −129.5 |
| Working Example | −132.0 |

As shown in Table 1, in the working example where the ferrite bead 14 was disposed, the reception band noise at the transmission output of about 28 dBm was reduced in comparison with the comparative example where the ferrite bead 14 was not disposed. In other words, the reception band noise is improved by the ferrite bead 14 being disposed in series between the bias circuit 13 and the connection node n1.

With the high-frequency power amplifier according to the comparative example, a high-frequency transmission signal enters into the bias circuit 13 and oscillation is likely to occur. To deal with this, it can be considered to insert a resistance element between the bias circuit 13 and the connection node n1 so as to bring a damping effect. A resistance value of the stated resistance element is, for example, about 20Ω in this case. However, in this case, because a voltage drop occurs due to the above resistance when a DC bias current is supplied from the bias circuit 13, the saturation output of the high-frequency power amplifier is lowered.

As discussed above, the high-frequency signal amplifier circuit in which a resistance element is disposed in series between the bias circuit 13 and the connection node n1 cannot realize both the enhancement of the amplification performance and the reduction in the reception band noise level at the same time. In contrast, the high-frequency signal amplifier circuit according to the working example can realize both the enhancement of the amplification performance and the reduction in the reception band noise level at the same time.

The ferrite bead 14 can be formed with a ferrite containing Ni and Zn.

Figure 5:
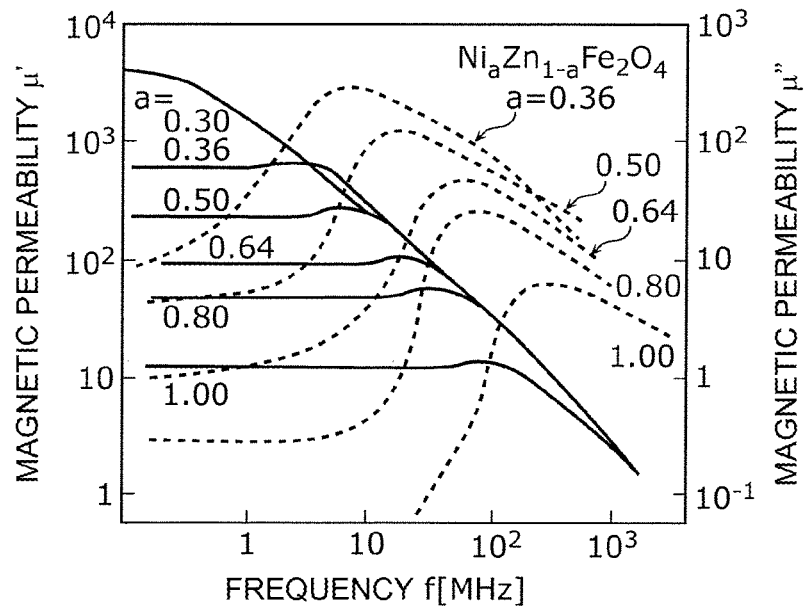
FIG. 5 is a graph depicting frequency characteristics of magnetic permeability of a Ni—Zn based ferrite.

FIG. 5 is a graph depicting frequency characteristics of magnetic permeability of a Ni—Zn based ferrite. In the graph, frequency dependence of complex magnetic permeability μ' (real part) and frequency dependence of complex magnetic permeability μ" (imaginary part) are depicted in the case where a composition ratio "a" of the Ni—Zn based ferrite ($Ni_aZn_{1-a}Fe_2O_4$) is changed. As shown in FIG. 5, the frequency dependence of magnetic permeability of the Ni—Zn based ferrite ($Ni_aZn_{1-a}Fe_2O_4$) is changed depending on the composition ratio a of Ni and Zn. Due to this frequency dependence of the magnetic permeability, the Ni—Zn based ferrite is a material capable of lowering the impedance in DC and raising the impedance in a desired high-frequency band by increasing the magnetic permeability. This makes it possible to optimize the frequency characteristics of impedance of the ferrite bead corresponding to the frequency band to be used and the above-discussed difference frequency band.

In the case where a Ni—Zn based ferrite ($Ni_aZn_{1-a}Fe_2O_4$) is used for the ferrite bead 14 according to the present embodiment, because such characteristics are required that the magnetic permeability is high in a difference frequency band $|f_{Tx}-f_{RX}|$ and the magnetic permeability is low in a transmission frequency band ($f_{Tx}$), the composition ratio a can be no more than about 0.36 as understood from FIG. 5.

Further, the subsequent amplifier device 10B may be configured of the high-frequency amplifier circuit according to the present embodiment. In a power amplifier module in which a plurality of amplifier devices are disposed in multiple stages in accordance with the required specifications, it is most important to enhance amplification performance and noise suppressing performance of the amplifier device in the last stage in which high power is processed. According to the above configuration, the subsequent amplifier device 10B is configured of the high-frequency signal amplifier circuit having the above-mentioned features, thereby making it possible to efficiently optimize the amplification performance and noise suppressing performance of the power amplifier module 10.

Meanwhile, in the case where the preceding amplifier device 10A is configured of the high-frequency amplifier circuit according to the present embodiment, because deformation and reception band noise of a high-frequency transmission signal can be reduced, in advance, at a stage of being a small signal, the circuit configurations of the variable filter circuit 10F and the subsequent amplifier device 10B in the subsequent stage can be simplified.

The high-frequency amplifier circuit may be configured of a CMOS (Complementary Metal Oxide Semiconductor). This makes it possible to manufacture the PA module 10 at a lower cost.

Further, the high-frequency amplifier circuit may be formed of GaAs. With this, a high-frequency transmission signal having high-quality amplification performance and noise suppressing performance can be outputted.

Second Embodiment

In a second embodiment, described is a configuration in which an arrangement relationship among the preceding amplifier device 10A configured of the high-frequency signal amplifier circuit according to the first embodiment, the subsequent amplifier device 10B, and the variable filter circuit 10F is optimized.

In the case where each of the preceding amplifier device 10A, the subsequent amplifier device 10B, the variable filter circuit 10F, and the control IC 70 is configured of a different chip, the resultant circuit configuration cannot contribute to the miniaturization of the front-end circuit 1. Meanwhile, in the case where the preceding amplifier device 10A and the subsequent amplifier device 10B are integrated in the same chip in order to realize the miniaturization, there arises a risk that the quality of a transmission signal is deteriorated due to oscillation or the like generated by strengthened mutual interference between the high-frequency signals.

Figure 6A:
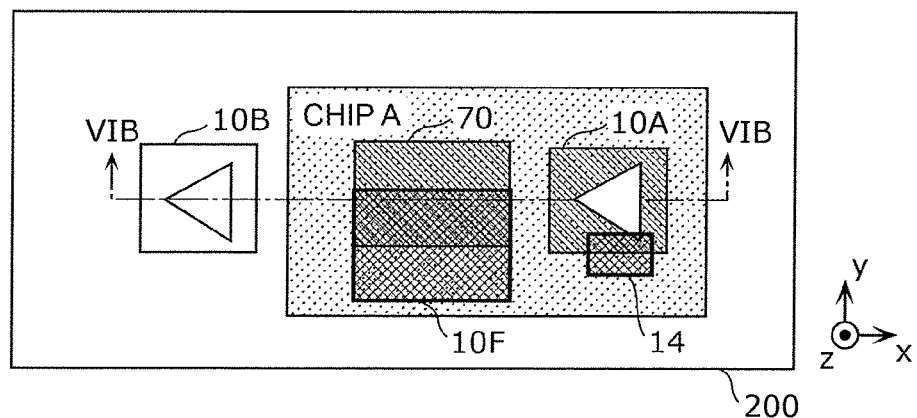
FIG. 6A is a plan configuration view of a PA module according to a second embodiment.

FIG. 6A is a plan configuration view of a PA module according to the second embodiment. In the front-end circuit 1 according to the present embodiment, the preceding amplifier device 10A and the control IC 70 are integrated, excluding the ferrite bead 14, in a chip A (first chip) as a single chip. Note that the subsequent amplifier device 10B is not included in the chip A.

According to the above configuration, the control IC 70 is integrated in a single chip along with the preceding amplifier device 10A which is unlikely to be interfered with by a high-frequency transmission signal, thereby making it possible to realize the miniaturization while maintaining the quality of high-frequency signals. Further, configuring the preceding amplifier device 10A and the subsequent amplifier device 10B in different chips makes it possible to suppress mutual interference between the high-frequency signals. Moreover, by the ferrite bead 14 being not included in the chip A, heat generated in the ferrite bead 14 is prevented from being accumulated in the chip A.

The chip A can be configured of a CMOS. With this, the PA module 10 can be manufactured at a lower cost, because the control IC 70 and the preceding amplifier device 10A for which power handling is not needed are configured of the CMOS.

Further, the chip A may be formed of GaAs. With this, a high-frequency transmission signal having high-quality amplification performance and noise suppressing performance can be outputted.

The switch device included in the variable filter circuit 10F may be included in the chip A. This makes it possible to realize the front-end circuit 1 being further miniaturized.

Figure 6B:
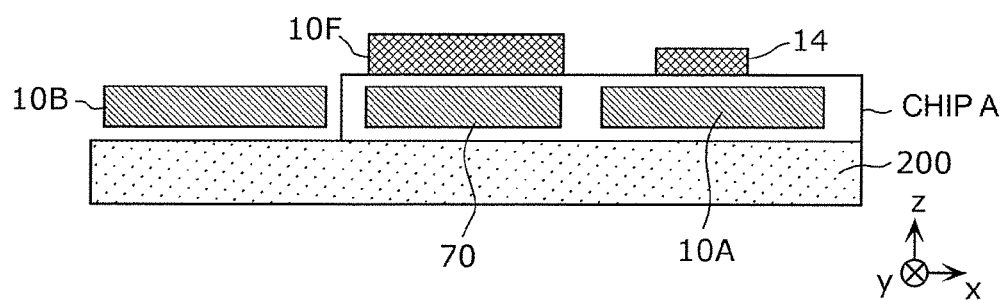
FIG. 6B is a cross-sectional configuration view of the PA module according to the second embodiment.
Figure 7:
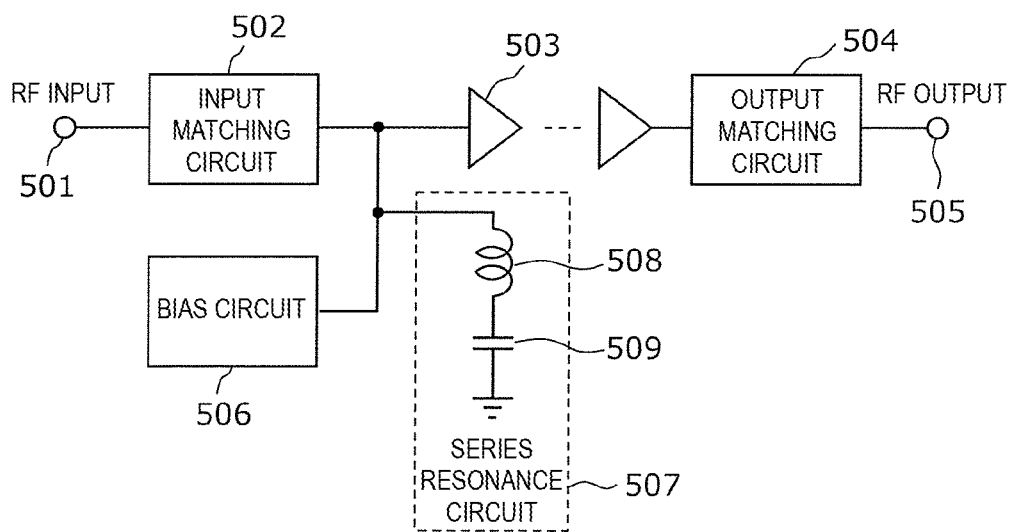
FIG. 7 is a circuit block diagram of a high-frequency power amplifier disclosed in International Publication No. WO 2014/087479.

FIG. 6B is a cross-sectional configuration view of the PA module according to the second embodiment. To be specific, FIG. 6B is a cross-sectional view taken along a VIB-VIB line in FIG. 6A. As shown in FIGS. 6A and 6B, in the PA module 10 according to the present embodiment, the preceding amplifier device 10A, the subsequent amplifier device 10B, the control IC 70, the ferrite bead 14, and the variable filter circuit 10F are arranged and mounted on a substrate 200 (in a z-axis direction in the drawing). Further, the ferrite bead 14 and the variable filter circuit 10F are respectively arranged and laminated so as to overlap with the chip A. In other words, the ferrite bead 14 attached to the outside of the chip A is arranged and laminated so as to overlap with the chip A in a planar view of the substrate 200.

With this, in addition to the reduction in area by integrating the preceding amplifier device 10A and the control IC 70 in a single chip, a further reduction in area of the PA module 10 can be achieved by laminating the preceding amplifier device 10A and the ferrite bead 14 together. This makes it possible to realize further miniaturization while maintaining the quality of high-frequency signals.

In the case where the subsequent amplifier device 10B is configured of the high-frequency signal amplifier circuit according to the first embodiment, the ferrite bead 14 included in the subsequent amplifier device 10B may not be arranged and laminated on the subsequent amplifier device 10B, but may be arranged and laminated on the chip A including the preceding amplifier device 10A. This makes it possible to prevent a situation where the characteristics of the ferrite bead 14 are changed being affected by the heat generated in the subsequent amplifier device 10B, which outputs high power.

Other Embodiments and the Like

Thus far, the high-frequency signal amplifier circuit, the PA module 10, the front-end circuit 1, and the communication apparatus 100 according to the embodiments of the present disclosure have been described by illustrating the first and second embodiments. However, the high-frequency signal amplifier circuit, the PA module 10, the front-end circuit 1, and the communication apparatus 100 of the present disclosure are not limited to the above embodiments. The following are also included in the present disclosure: that is, other embodiments realized by combining arbitrary constituent elements of the aforementioned embodiments, variation examples obtained by making various kinds of variations, conceived by those skilled in the art, on the above-discussed embodiments without necessarily departing from the spirit and scope of the disclosure, various types of apparatuses having the high-frequency signal amplifier circuit or the PA module 10 disclosed in the embodiments of the present disclosure, and so on.

In the high-frequency signal amplifier circuit and the PA module 10 according to the above-discussed embodiments, between the circuit devices and the paths connecting the signal paths, which are disclosed in the drawings, other high-frequency circuit devices, wiring, and the like may be inserted.

The variable filter circuit 10F may be a filter circuit configured to attenuate frequency bands other than channels in use in the not-used channels of TV, and/or IMD noise. With this configuration, in a system making use of the not-used channels within the TV channels for other communications, the frequency of a channel adjacent to the channel in use can be attenuated. This makes it possible to effectively make use of the not-used channels of the TV channels.

Further, the control IC 70 according to the embodiments of the present disclosure may be realized as an IC, which is an integrated circuit, or an LSI (Large Scale Integration). A method for the circuit integration may be realized with a dedicated circuit or a general-purpose processor. An FPGA (Field Programmable Gate Array) which can be programmed after LSI manufacturing, a reconfigurable processor capable of reconfiguring connections, settings, and the like of circuit cells inside the LSI, or the like may be used. Moreover, in the case of the advent of a new technology of the circuit integration capable of replacing LSIs by the progress of the semiconductor technology or by another technology derived therefrom, it is a matter of course to integrate the function blocks using the new technology.

The present disclosure can be widely applied to communication apparatuses such as a cellular phone and the like as a power amplifier module disposed in a front-end section supporting multiband/multimode use.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency signal amplifier circuit that is used in a front-end circuit that is configured to propagate a high-frequency transmission signal and a high-frequency reception signal, comprising:
   an amplifier transistor configured to amplify the high-frequency transmission signal;
   a bias circuit having an output end that supplies a bias to a signal input terminal of the amplifier transistor; and
   a ferrite bead,
   wherein a first end of the ferrite bead is connected to the output end of the bias circuit and a second end of the ferrite bead is connected to the signal input terminal of the amplifier transistor, and
   wherein an impedance of the ferrite bead in a difference frequency band between the high-frequency transmission signal and the high-frequency reception signal is higher than a direct current (DC) impedance of the ferrite bead.

2. The high-frequency signal amplifier circuit according to claim 1,
   wherein an impedance of the ferrite bead at a transmission frequency of the high-frequency transmission signal is lower than the impedance of the ferrite bead in the difference frequency band.

3. The high-frequency signal amplifier circuit according to claim 1 or 2, wherein the ferrite bead comprises a ferrite containing Ni and Zn.

4. A power amplifier module comprising:
   a preceding amplifier device configured to amplify a high-frequency transmission signal; and
   a subsequent amplifier device configured to amplify the high-frequency transmission signal having been amplified by the preceding amplifier device,
   wherein the subsequent amplifier device comprises the high-frequency signal amplifier circuit according to claim 1.

5. The power amplifier module according to claim 4, wherein the first chip is a CMOS chip.

6. The power amplifier module according to claim 4, wherein the first chip comprises GaAs.

7. A front-end circuit comprising:
   the power amplifier module according to claim 4;
   a transmission filter and a reception filter; and
   a branching filter that outputs a high-frequency reception signal from an antenna to the reception filter and outputs a high-frequency transmission signal to the antenna, wherein the high-frequency transmission signal is amplified by the power amplifier module and then filtered by the transmission filter.

8. The front-end circuit according to claim 7, further comprising:
   a variable filter circuit that is disposed between the preceding amplifier and the subsequent amplifier and that varies a pass band or an attenuation band corresponding to a frequency band of the high-frequency transmission signal.

9. The front-end circuit according to claim 8,
   wherein the pass band is a transmission band corresponding to a communication mode in use and selected from a plurality of communication modes, and
   wherein the attenuation band is a reception band corresponding to the communication mode in use.

10. A communication apparatus comprising:
the front-end circuit according to claim 7;
an RF signal processing circuit configured to output a high-frequency transmission signal to the front-end circuit and receive a high-frequency reception signal from the front end circuit; and
a baseband signal processing circuit configured to:
　convert the high-frequency reception signal inputted from the RF signal processing circuit to an intermediate frequency signal,
　perform signal processing on the intermediate frequency signal, and
　convert the intermediate frequency signal to a high-frequency signal so as to output the converted signal to the RF signal processing circuit.

11. A power amplifier module comprising:
a preceding amplifier configured to amplify a high-frequency transmission signal;
a subsequent amplifier configured to amplify the high-frequency transmission signal having been amplified by the preceding amplifier; and
an amplification controller configured to control amplification characteristics of the preceding amplifier device and the subsequent amplifier device according to a frequency band of the high-frequency transmission signal,
wherein the preceding amplifier comprises the high-frequency signal amplifier circuit according to claim 1,
the amplification controller and the preceding amplifier excluding the ferrite bead are integrated in a first chip,
the first chip and the subsequent amplifier are disposed on a substrate, and
the ferrite bead is arranged and laminated so as to overlap the first chip in a planar view of the substrate.

12. The front-end circuit according to claim 11, further comprising:
a variable filter circuit that is disposed between the preceding amplifier and the subsequent amplifier and that varies a pass band or an attenuation band corresponding to a frequency band of the high-frequency transmission signal,
wherein the ferrite bead and the variable filter circuit are arranged adjacent to each other and laminated so as to overlap the first chip in a planar view of the substrate.

13. The front-end circuit according to claim 12, wherein, in the planar view of the substrate, the ferrite bead is arranged above a portion of first chip having the preceding amplifier, and the variable filter circuit is arranged above a portion of the first chip having the amplification controller.

* * * * *